United States Patent
Delshadpour et al.

(10) Patent No.: US 11,228,314 B1
(45) Date of Patent: Jan. 18, 2022

(54) SLEW RATE CONTROL

(71) Applicant: NXP B.V., Eindhoven (NL)

(72) Inventors: Siamak Delshadpour, Phoenix (AZ); Xueyang Geng, Chandler (AZ)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/080,791

(22) Filed: Oct. 26, 2020

(51) Int. Cl.
| | | |
|---|---|---|
| *H03K 19/0175* | (2006.01) | |
| *H03K 17/567* | (2006.01) | |
| *H03K 19/00* | (2006.01) | |
| *H03K 19/003* | (2006.01) | |
| *H03K 17/16* | (2006.01) | |

(52) U.S. Cl.
CPC ... *H03K 19/017545* (2013.01); *H03K 17/168* (2013.01); *H03K 17/567* (2013.01); *H03K 19/0005* (2013.01); *H03K 19/00346* (2013.01)

(58) Field of Classification Search
CPC .... H03K 17/00; H03K 17/163; H03K 17/168; H03K 17/567; H03K 19/00; H03K 19/0005; H03K 19/00346; H03K 19/00361; H03K 19/00384; H03K 19/017545; H03K 5/00; H03K 5/01; H03K 5/12

USPC .......................................................... 327/170
See application file for complete search history.

(56) References Cited

U.S. PATENT DOCUMENTS

| | | | |
|---|---|---|---|
| 6,040,724 A * | 3/2000 | Kamiya | ............... H03K 4/00 327/134 |
| 6,172,541 B1 | 1/2001 | Young et al. | |
| 6,271,699 B1 | 8/2001 | Dowlatabadi et al. | |
| 6,700,422 B2 | 3/2004 | Tang et al. | |
| 6,903,588 B2 | 6/2005 | Vorenkamp | |
| 7,030,670 B2 | 4/2006 | Lin | |
| 7,760,199 B2 | 7/2010 | An | |
| 2004/0140833 A1* | 7/2004 | Kim | ................ H03K 17/166 327/170 |

\* cited by examiner

*Primary Examiner* — Lincoln D Donovan
*Assistant Examiner* — Dave Mattison

(57) ABSTRACT

A slew rate control circuit is disclosed. The slew rate control circuit includes an input port to receive an input signal, a transmitter to transmit the input signal to an output port and an impedance control circuit coupled between the transmitter and the output port. The impedance control circuit has an adjustable impedance that is configured to be adjusted during a rise and a fall of the input signal using a trim code and an one shot pulse.

20 Claims, 5 Drawing Sheets

SLEW RATE CONTROL

BACKGROUND

Universal Serial Bus (USB) devices that communicate with a host over USB include USB printers, scanners, digital cameras, storage devices, card readers, and the like. USB based systems may require that a USB host controller be present in the host system, and that the operating system (OS) of the host system support USB and USB Mass Storage Class Devices. USB2 devices may communicate over the USB bus at low speed (LS), full speed (FS), or high speed (HS). A connection between a USB device and a host may be established via a four wire interface that includes a power line, a ground line, and a pair of data line, differential voltage plus (D+) and differential voltage minus (D−), or for the case of USB On-The-Go (OTG), a fifth line named ID (identification pin) may be added. When a USB device connects to the host, the USB device may first pull a D+ line high (or the D− line if the device is a low speed device) using a pull up resistor on the D+ line when connecting as FS (Full Speed) mode. The host may respond by resetting the USB device. If the USB device is a high-speed USB device, the USB device may "chirp" by driving the D− line high during the reset. The host may respond to the "chirp" by alternately driving the D+ and D− lines high. The USB device may then electronically remove the pull up resistor and continue communicating at high speed if both communicating devices are HS capable. Disconnection at high-speed happens when a cable is removed and HS RX terminal on USB device is removed. It results in doubling HS amplitude on the USB host transmitter. The USB2 specification defines a mechanism to detect differential line voltage using differential difference receiver detectors.

The success of USB2.0 technology has enjoyed wide adoption in almost every computing device, with tremendous ecosystem support not only in terms of device choice to support various platform features, but also in terms of technology development with well-established hardware IP portfolios and standardized software infrastructure. It is foreseeable that the great asset of USB2.0 technology will continue to benefit the ecosystem for years to come. As power efficiency becomes increasingly critical in today's computing devices, there is a need for IO technology to be optimized for both active and idle power. USB2.0 technology, originally optimized for external device interconnect, is primed to be enhanced for inter-chip interconnect such that the link power can be further optimized. Meantime, silicon technology continues to scale. Device dimensions are getting smaller and therefore more devices can be packed onto a single integrated chip. However, the device reliability challenge arising from the densely packed transistors has become more profound. The manufacturing cost for an advanced process technology to support 3.3V IO signaling has grown exponentially. A low voltage USB2.0 solution is therefore required to address the gap. Embedded USB is a newer standard to fill the gap caused due to advance silicon processes.

At system level, eUSB2 to USB2.0 bridge (eUSB2 repeater) is required to support host (SoC) communication to external USB2.0 compliant devices via USB connectors. eUSB2/USB2 and USB2/USB2 repeaters require both squelch detector (SQD) and disconnect detector (DCD) at USB2.0 connector port for highspeed (HS) communication (SQD and DCD for USB2 port and SQD for eUSB port). Each of the SQD and DCD work at 480 Mbps range, but support different functionalities. The invention describes method to combine squelch detector and disconnect detector in an eUSB2 or USB2 repeater.

SUMMARY

In one embodiment, slew rate control circuit is disclosed. The slew rate control circuit includes an input port to receive an input signal, a transmitter to transmit the input signal to an output port and an impedance control circuit coupled between the transmitter and the output port. The impedance control circuit has an adjustable impedance that is configured to be adjusted during a rise and a fall of the input signal using a trim code and an one shot pulse In some examples, the impedance control circuit includes one or more resistors each coupled with a switch in series. The impedance control circuit includes a second resistor that is coupled in parallel with the one or more resistors and the switch. The value of the second resistor is equivalent to a predetermined output impedance of the slew rate control circuit. The slew rate control circuit may also include an one shot generation circuit to generate the one shot pulse at a rising edge of the input signal. The one shot generation circuit further configured to generate the one shot pulse at a falling edge of the input signal. The one shot generation circuit includes one or more RC stages. The number of the one or more RC stages depends on a desired pulse width of the one shot pulse. The trim code is disabled/enabled during a pulse width of the one shot pulse to turn the switches of the weighted resistors on or off. The slew rate control circuit may also include a decoder to increase a width of the trim code and the decoded trim code is used to drive switches coupled in series with the one or more resistors. The decoded trim code is configured to turn off one or more switches coupled in series with the one or more resistors to temporarily increase the adjustable impedance during a pulse width period of the one shot pulse. The impedance control circuit is configured to revert back the adjustable impedance to an original value that exists prior to the rising edge of the one shot pulse at a falling edge of the one shot pulse.

In some examples, the slew rate control circuit may be employed in USB repeater or transceiver or the slew rate control circuit may also be employed in a USB to embedded USB (eUSB) repeater.

In some examples, the trim code is predetermined and remains same during a plurality of pulse of the input signal. However, in some other embodiments, the trim code may be generated using a feedback loop. The feedback loop is configured to receive an input from the output port and to generate the trim code based on the input from the output port.

In another embodiment, a slew rate control circuit is disclosed. The slew rate control circuit includes an input port to receive an input signal, a transmitter to transmit the input signal to an output port, a feedback loop configured to receive an input from the output port to generate a one shot pulse width control signal and an impedance control circuit coupled between the transmitter and the output port. The impedance control circuit has an adjustable impedance that is configured to be adjusted during a rise and a fall of the input signal using the trim code and the one shot pulse. The trim code is enabled during a pulse width of the one shot pulse to temporality increase or decrease a value of the adjustable impedance.

The feedback loop may include a slew rate measurement module configured to measure a slew rate at the output port and an one shot pulse width adjustment module to generate a pulse width control signal based on the measured slew rate and a prestored desired slew rate value.

BRIEF DESCRIPTION OF THE DRAWINGS

Throughout the description, similar reference numbers may be used to identify similar elements.

DETAILED DESCRIPTION

Figure 1:
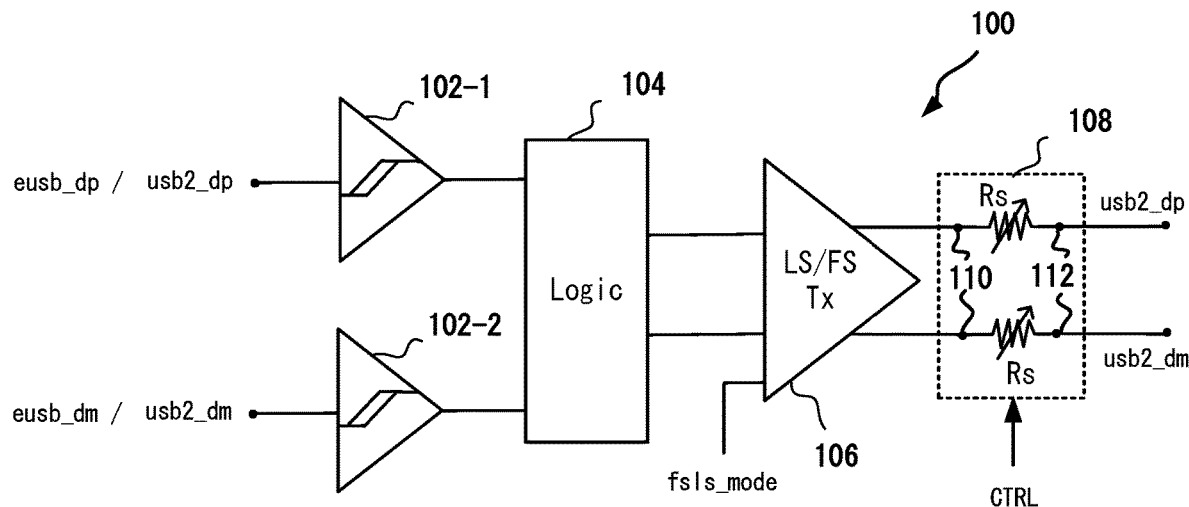
FIG. 1 illustrates a eUSB/USB2 or USB2/USB2 repeater circuit in accordance with one or more embodiments of the present disclosure.

It will be readily understood that the components of the embodiments as generally described herein and illustrated in the appended Figs. could be arranged and designed in a wide variety of different configurations. Thus, the following more detailed description of various embodiments, as represented in the Figs., is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Embodiments herein describe a slew rate or pulse rise/fall control circuit or circuits. Even though the description has used USB to describe the embodiments, a person skilled in the art would appreciate that the embodiment described herein may also be used in other application where there is a need to control the rise/fall time of a pulse.

FIG. 1 shows a simplified eUSB/USB2 or USB2/USB2 repeater 100 which is fully or semi differential. The repeater 100 includes input ports eusb_dp or usb2_dp (e.g., USB D+) and eusb_dm or usb2_dm (e.g., USB D−). Two input stages 102-1, 102-2 are included to receive the input signals. The input stages 102-1, 102-2 may include circuits to filter the noise and amplify the input signals. A logic circuit 104 may be included to combine predefined controlled bits to the input signals. The output of the logic circuit 104 is received by a Low Speed (LS)/Full Speed (FS) transmitter (Tx) 106. The LS/FS Tx 106 may also include an input signal fsls_mode to select FS mode or LS mode of transmission. The appropriate transmission mode can be selected based on a destination device that is receiving the data. Typically, in LS mode, the LS/FS Tx 106 will transmit data at 1.5 Mbps and in FS mode, the data transmission rate can be 12 Mbps. In some embodiments, a high speed mode (HS) may be included to transmit data at 480 Mbps.

The output of the LS/FS Tx 106 is coupled with a termination stage 108 to provide a required output impedance. Typically, USB2 standards require a typical output impedance of 45 ohms with an acceptable range from 40 to 50 ohms. Process variation without trimming or calibration, depends on the employed technology, can be ~±15-30% instead of ~±10% allowable range which leads to need of trimming/calibration. The termination stage 108 includes a resistor Rs (one for each D+ and D− lines) that includes a first terminal 110 and a second terminal 112. The termination stage 108 includes a port to receive a control signal CTRL. The termination stage 108 is configured to change its impedance based on the control signal CTRL.

Figure 2:
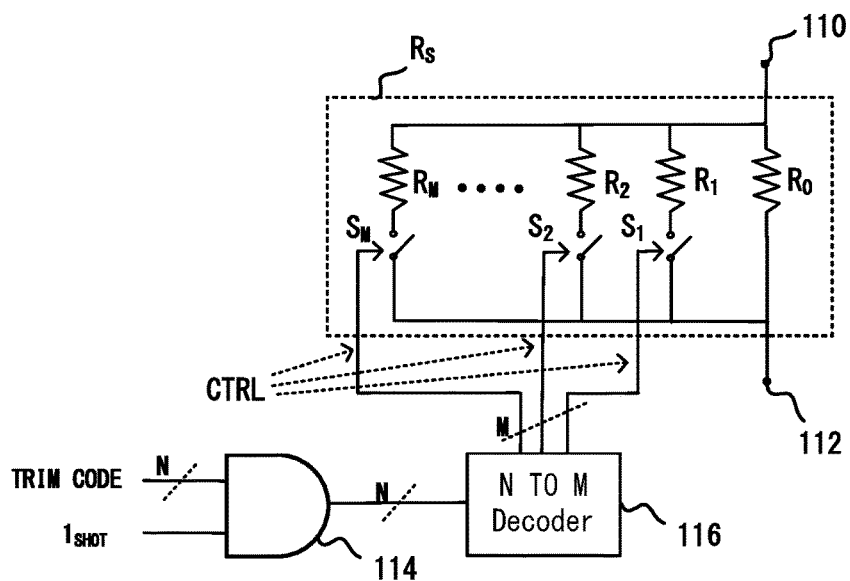
FIG. 2 illustrates a trimmable resistor configured to be controlled by one shot pulses in accordance with one or more embodiments of the present disclosure.

FIG. 2 shows the termination stage 108 coupled with a control circuit that generates the control signal CTRL. The control circuit includes one or more AND gates 114, each receive one bit of a trim code and a one-shot pulse. In some examples, the trim code may be predetermined through the process of calibration of the USB repeater 100 to achieve a desired slew rate at the output of the USB repeater 100. The trim code may be N bit wide where N can be equal to or more than one. The output of one or more AND gates 114 is inputted to a N-to-M decoder 116 to convert the N bit trim code to a M bit control signal (CTRL). One or more bits of the M bit control signal each is used to drive a switch (e.g., $S_1, S_2 \ldots S_M$ that are coupled in series with resistors $R_1, R_2 \ldots R_M$ respectively). At least one resistor $R_0$ does not include a switch in the series, hence even if all switches ($S_1, S_2 \ldots S_M$) are off, there will still be a predefined resistance between the terminals 110 and 112. In the USB2 example, the value of equal resistor, $R_S = R_0 \| B_1 R_1 \| \ldots \| B_M R_M$ (are bits of the decoded trimming/calibration code which can be 0 or 1 depending on captured code) can be 45 ohms. However, the value of equal resistor, $R_S$ may be different for different types of applications.

Figure 3:
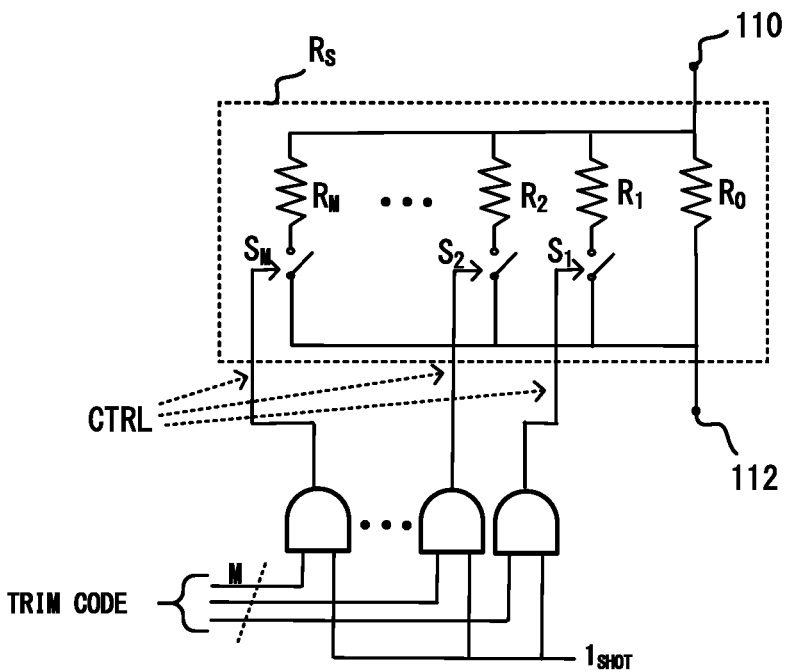
FIG. 3 shows a trimmable resistor configured to be controlled by one shot pulses in accordance with one or more embodiments of the present disclosure.

FIG. 3 shows the control circuit of FIG. 2 in another embodiment. In this example, a trim code may be inputted to one or more AND gates and the outputs of each of these AND gates may drive the switches $S_1, S_2 \ldots S_M$ directly instead of using a decoder 116 (of FIG. 2). In some embodiment, gate drivers to amplify signals may be used at the output of the AND gates.

Figure 4:
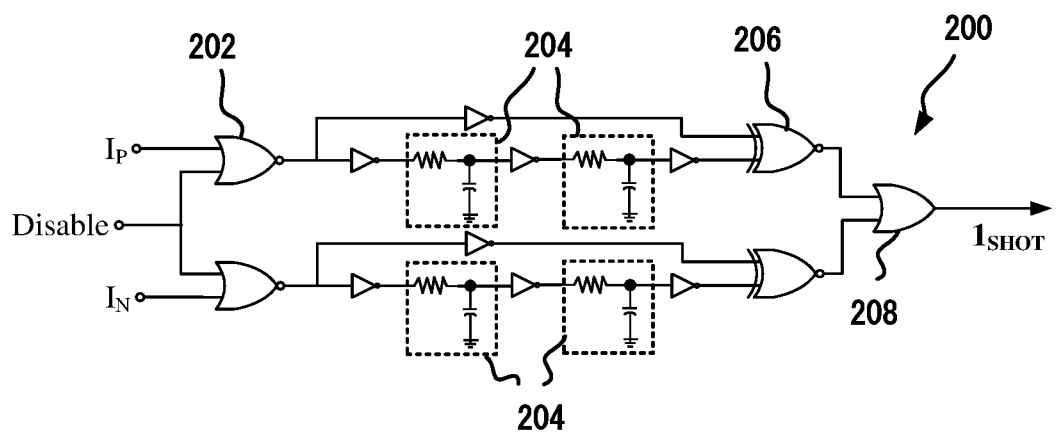
FIG. 4 shows a sample one shot pulse generator circuit in accordance with one or more embodiments.

FIG. 4 shows a sample one-shot pulse generation circuit 200. The circuit 200 includes two parallel symmetrical paths, for D+ and D− inputs. the input $I_P$ corresponds to D+ and the input $I_N$ corresponds to D−. A Disable input port may be included to enable and disable the generation of one-shot pulses. The inputs $I_P$ and $I_N$ each is coupled to the of a NOR gate 202. The output of the NOR gate 202 is bifurcated into two paths, one path, through a NOT gate, is inputted to the first input of a XNOR gate 206 and the second path is inputted to the second input of the XNOR gate 206. The second path includes one or more RC (resistor-capacitor) stages 204. Each of the RC stages 204 includes or preceded by a NOT gate. The number of RC stages 204 or the values of RC components in the RC stages 204 determines the pulse width of the output one shot pulses. One shot pulses are generated at the rising and falling edges of the input pulse $I_P/I_N$. Therefore, for each input pulse, there will be two one shot pulses. To keep the one-shot pulse symmetrical during the rising and falling edges of the single ended signal, one-shot signal is generated based both on the positive and negative signals (e.g., D+ and D−). An AND (not shown) or OR gate 208 can be used to pick either the narrower or wider one-shot signal. The one-shot pulse generation circuit 200 described here provides a better tolerance to process related variances.

Figure 5:
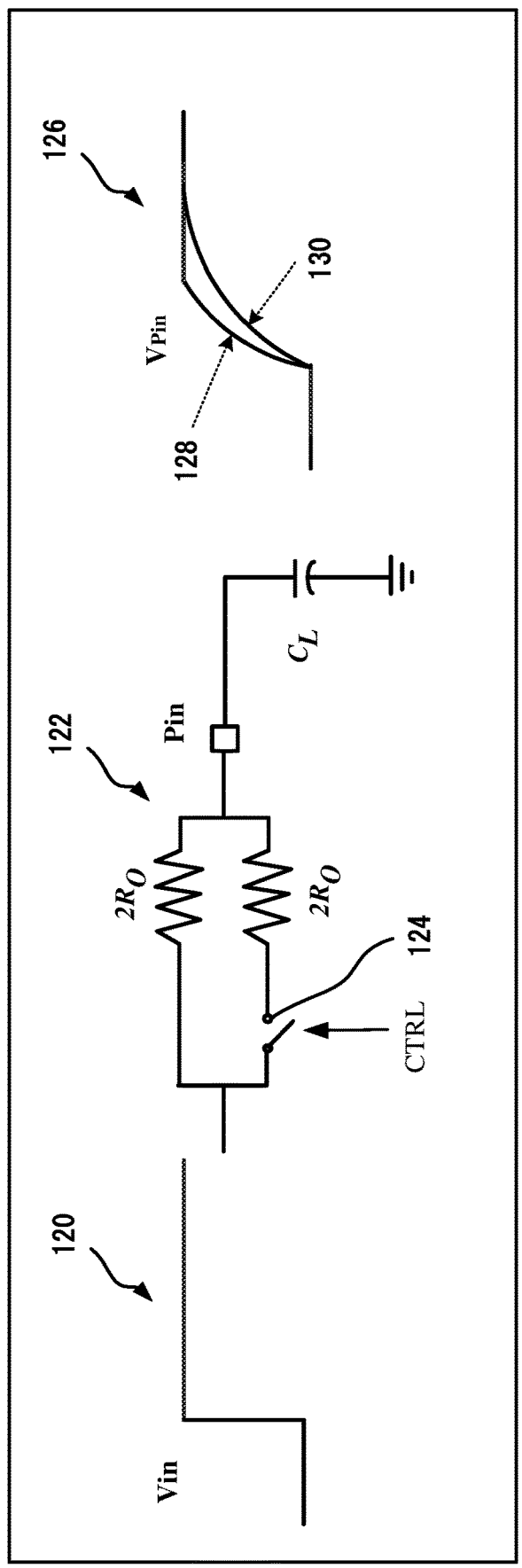
FIG. 5 shows a circuit to illustrate the slew rate control operations in accordance with one or more embodiments of the present disclosure.

FIG. 5 depicts a sample circuit 122 to describe the concept implemented through the embodiments described herein. The circuit 122 is a simplified representation of Rs of FIG. 1. In the USB examples, in one example, when I²C setting is OFF, the required rise/fall time can be between 8-15 ns. When I²C setting is ON, the required rise/fall time can be between 4-10 ns. To cater to both these settings, the rise/fall time of I²C ON settings should be increased to close to 8-15 ns. The rise/fall times can be increased by increasing the output impedance (e.g., the impedance of the terminating stage 108). However, doing so would make the USB repeater 100 noncompliant to the USB standards what requires an output impedance of 45 ohms. In one possible solution, a switchable capacitor may be included on-chip. However, such solutions have a big area penalty because capacitors take relatively more space on the chip. In one conventional method, the pre-driver (now shown) in the USB repeater is slowed down by introducing RC time constant in between the driver and pre-driver. However, this method requires a relatively larger die area on the silicon and consumes more power, yet the method may not provide highly accurate results. The embodiments described herein saves silicon area and power compared to conventional methods. FIG. 5 shows a rising part of an input signal pulse 120. The circuit 122 includes two resistors coupled in parallel. In this examples, each of the two resistors are equal value and each has a value that is double than the required output impedance (e.g., 45 ohms). One of the two resistors are coupled with a switch 124 that is controllable by the control signal CTRL. A capacitor CL is coupled at the output. An output pulse 126 is illustrated to show the voltage rise $V_{PIN}$ at $P_{IN}$. When the switch closed, the total impedance is $R_0$ (which can be 45 ohms in this example) and the curve 128 is resulted. However, the slew rate of the curve 128 needs to be reduced without making the USB repeater 100 out of compliance. If the switch 124 is opened for a brief period when the input pulse start to rise, the impedance seen at $P_{IN}$ will be $2R_0$. This increased impedance will cause the rise of the pulse at the output to slow to result in the curve 130. The switch 124 may be opened for a brief duration of time through the control signal CTRL that is generated by a one-shot circuit as described above.

Figure 6:
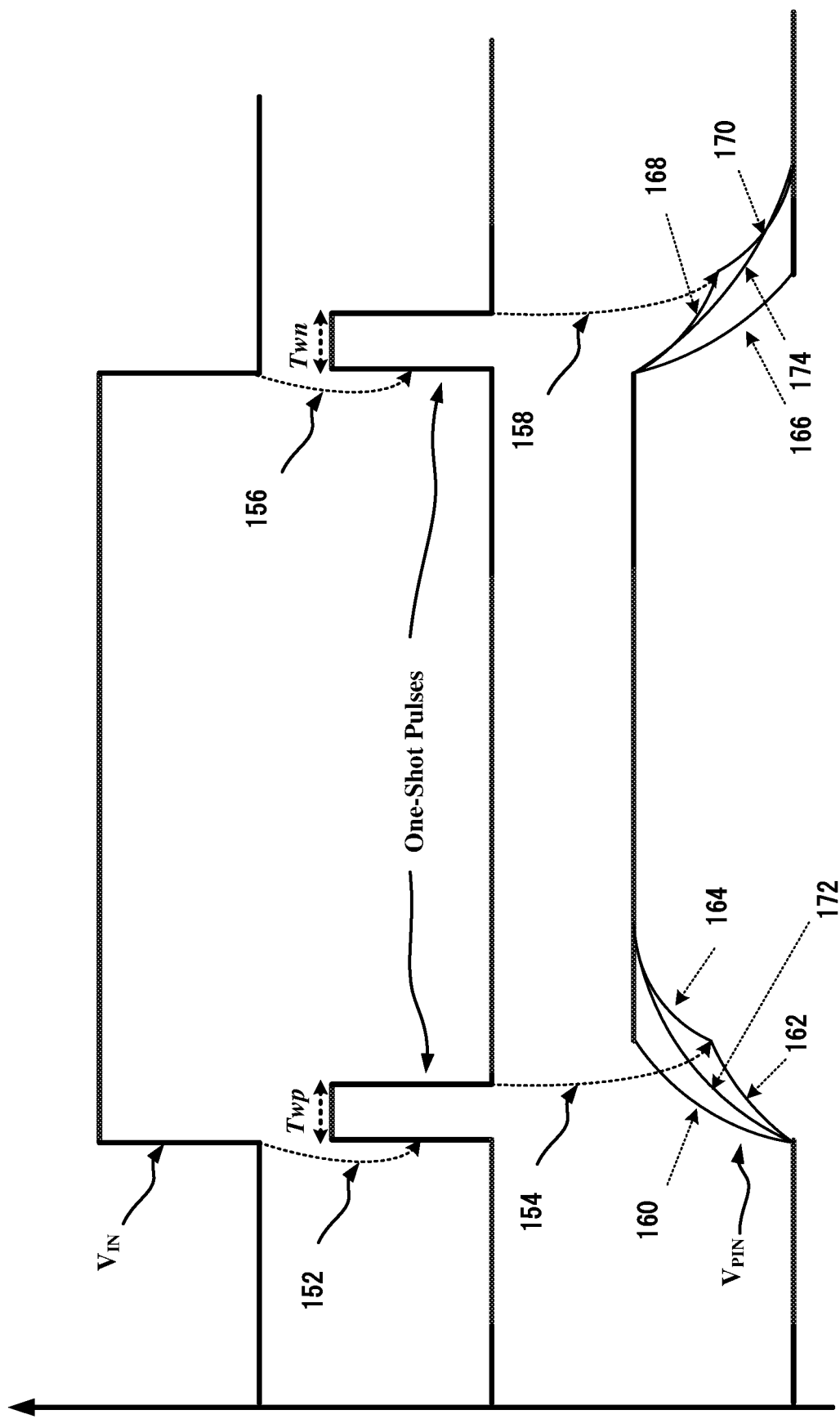
FIG. 6 shows an input pulse, an one shot pulse and an output pulse in accordance with one or more embodiments of the present disclosure.

FIG. 6 illustrates an input pulse $V_{IN}$, one-shot pulses and the output pulse showing various rise/fall curves. The curve 160 is a rising curve and the curve 166 is a falling curve if some or all switches $S_1, S_2 \ldots S_M$ are closed (through the trim code or the control signal CTRL) such that the overall impedance of the termination stage 108 is $R_0$ (e.g., 45 ohms in the USB example). The curve 160 and 166 need to be slowed during a brief period of time as defined by the pulse widths $T_{WP}$, $T_{WN}$ of the one-shot pulses. The pulse widths $T_{WP}$, $T_{WN}$ can be equal or different and in some examples, the widths are narrow enough so that the one-shot pulses disappear before a reflection arrives from the output. The pulse widths can also be predetermined through a test or calibration process by altering the one-shot pulse generation circuit 114.

As pointed out by the arrow 152, the one-shot pulse is generated when the $V_{IN}$ pulse rises. Similarly, as pointed out by the arrow 156, another one-shot pulse is generated at the falling edge of the $V_{IN}$ pulse. During the period $T_{WP}$, the one-shot signal input to the circuit that generates the control signal CTRL based on the trim code (see FIGS. 2, 3) turns off one or more switches $S_1, S_2 \ldots S_M$ thus causing to increase the overall impedance during the period $T_{WP}$. The increased impedance during the time $T_{WP}$ causes the output voltage rise slowly (e.g., the curve 162). As pointed out by the arrow 154, at the end of the one-shot pulse (e.g., after the time $T_{WP}$), the one or more switches that were opened are now closed and the output voltage has started to rise rapidly to follow the curve 164. Similarly, as pointed by the arrow 156, at the falling edge of the input pulse, the second one-shot pulse is generated. The second one-shot pulse has the width of $T_{WN}$. During this time $T_{WN}$, one or more switches $S_1, S_2 \ldots S_M$ are opened to cause an increased impedance. The increased impedance during the period $T_{WN}$, cause the output pulse to follow the curve 168, which shows a slower fall than the curve 166. After the period $T_{WN}$, the one or more switches $S_1, S_2 \ldots S_M$ that were opened to increase the impedance closes again, thus reducing the impedance of the termination stage 108. The reduced impedance cause the output signal to fall comparatively rapidly to follow the curve 170. The trim code may be changed, for example, to achieve a different slew rate.

As shown, the switch over of the impedances during the rise and fall time of the input signal pulse may cause a non-smooth curve (e.g., the curve 162+ the curve 164). However, the curves 172 and 174 are the curves seen by the output because parasitic components creates a filter that naturally smooths out the bump between the curve 162 and the curve 164. The embodiments described herein can be used with any type of Tx driver that is required to show a certain output impedance for slew rate control purposes.

Figure 7:
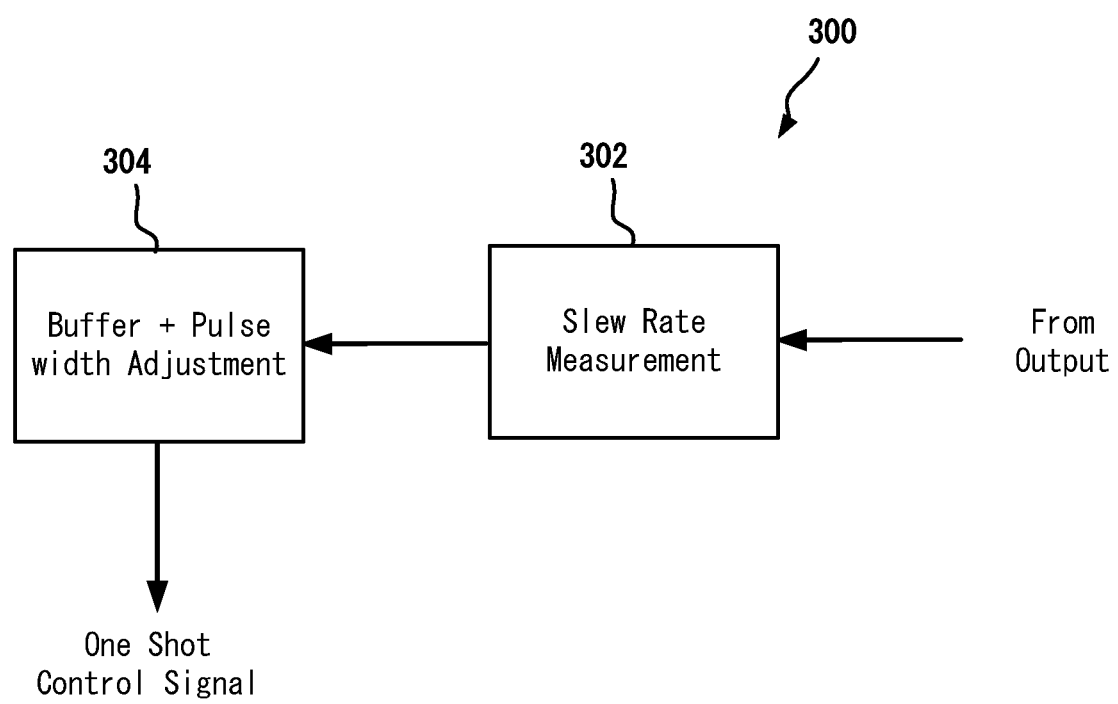
FIG. 7 shows a sample feedback look to generate a trim code in accordance with one or more embodiments of the present disclosure.

As stated above, even though the embodiments herein are described using a USB application, these embodiments can be employed in application where a slew rate needs to be controlled by temporarily changing the output impedance. The slew rate can be increased or decreased using the embodiments described using by using an appropriate trim code. In some other examples, a feedback loop 300 as shown in FIG. 7 may be employed to achieve a desired predetermined slew rate. From the output of a circuit, a slew rate measurement module 302 may take samples at predetermined intervals (e.g., 1-2 ns) to determine the slew rate. A pulse width adjustment module 304 compares the measure slew rate with the prestored desired slew rate that may be stored in a buffer or may be inputted to the pulse width adjustment module 304, and generates a pulse width control signal to either increase the pulse width of the one shot pulse if the measured slew rate is faster than the prestored slew rate or decrease the pulse width of the one shot pulse if the measured slew rate is slower than the prestored slew rate by changing the number of the RC stages 204 (FIG. 4). In this example, the RC stages 204 may be bypassed using bypass switches (not shown) coupled in parallel. The bypass switches are controllable by the pulse width control signal.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program.

The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments that use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A slew rate control circuit, comprising:
   an input port to receive an input signal;
   a transmitter to transmit the input signal to an output port; and
   an impedance control circuit coupled between the transmitter and the output port, wherein the impedance control circuit having an adjustable impedance that is configured to be adjusted during a rise and a fall of the input signal using a trim code and an one shot pulse.

2. The circuit of claim 1, wherein the impedance control circuit includes one or more resistors each coupled with a switch in series.

3. The circuit of claim 2, wherein the impedance control circuit includes a second resistor that is coupled in parallel with the one or more resistors and the switch.

4. The circuit of claim 3, wherein a value of the second resistor is equivalent to a predetermined output impedance of the slew rate control circuit.

5. The circuit of claim 1, further including a one shot generation circuit to generate the one shot pulse at a rising edge of the input signal.

6. The circuit of claim 5, wherein the one shot generation circuit further configured to generate the one shot pulse at a falling edge of the input signal.

7. The circuit of claim 6, wherein the one shot generation circuit includes one or more RC stages.

8. The circuit of claim 7, wherein a number of the one or more RC stages depends on a desired pulse width of the one shot pulse.

9. The circuit of claim 2, wherein the trim code is enabled during a pulse width of the one shot pulse to turn the switch on or off.

10. The circuit of claim 2, further including a decoder to increase a width of the trim code and the decoded trim code is used to drive switches coupled in series with the one or more resistors.

11. The circuit of claim 10, wherein the decoded trim code is configured to turn off one or more switches coupled in serious with the one or more resistors to temporarily increase the adjustable impedance during a pulse width period of the one shot pulse.

12. The circuit of claim 11, wherein the impedance control circuit is configured to revert back the adjustable impedance to an original value that exists prior to the rising edge of the one shot pulse at a falling edge of the one shot pulse.

13. A universal serial bus (USB) repeater or transceiver including a slew rate control circuit, the slew rate control circuit comprising:
   an input port to receive an input signal;
   a transmitter to transmit the input signal to an output port; and
   an impedance control circuit coupled between the transmitter and the output port, wherein the impedance control circuit having an adjustable impedance that is configured to be adjusted during a rise and a fall of the input signal using a trim code and an one shot pulse.

14. A universal serial bus (USB) to embedded USB (eUSB) repeater including a slew rate control circuit, the slew rate control circuit comprising:
   an input port to receive an input signal;
   a transmitter to transmit the input signal to an output port; and
   an impedance control circuit coupled between the transmitter and the output port, wherein the impedance control circuit having an adjustable impedance that is configured to be adjusted during a rise and a fall of the input signal using a trim code and an one shot pulse.

15. The circuit of claim 1, wherein the trim code is predetermined and remains same during a plurality of pulses of the input signal, wherein the trim code is selected based on a predetermined slew rate.

16. The circuit of claim 1, further including a feedback loop configured to receive an input from the output port and to generate a pulse width control signal based on the input from the output port, wherein width of the one shot pulse is configured to be controlled by the pulse width control signal.

17. A slew rate control circuit, comprising:
   an input port to receive an input signal;
   a transmitter to transmit the input signal to an output port;

a feedback loop configured to receive an input from the output port to generate a pulse width control signal; and an impedance control circuit coupled between the transmitter and the output port, wherein the impedance control circuit having an adjustable impedance that is configured to be adjusted during a rise and a fall of the input signal using a trim code and an one shot pulse, wherein the trim code is enabled during a pulse width of the one shot pulse to temporality increase or decrease a value of the adjustable impedance, wherein width of the one shot pulse is adjustable using the pulse width control signal.

18. The circuit of claim 17, wherein the feedback loop includes a slew rate measurement module configured to measure a slew rate at the output port.

19. The circuit of claim 18, wherein the feedback loop further includes a trim code generation module coupled to the output port of the slew rate measurement module and configured to generate a trim code based on the measured slew rate of a received signal and a prestored desired slew rate value.

20. The circuit of claim 17, wherein the impedance control circuit includes one or more resistors each coupled with a switch in series.

* * * * *